(12) United States Patent
Arai et al.

(10) Patent No.: US 7,795,662 B2
(45) Date of Patent: Sep. 14, 2010

(54) SEMICONDUCTOR MEMORY DEVICE AND METHOD FOR FABRICATING SAME

(75) Inventors: Hideyuki Arai, Toyama (JP); Takashi Nakabayashi, Toyama (JP)

(73) Assignee: Panasonic Corporation, Osaka (JP)

( * ) Notice: Subject to any disclaimer, the term of this patent is extended or adjusted under 35 U.S.C. 154(b) by 286 days.

(21) Appl. No.: 11/822,921

(22) Filed: Jul. 11, 2007

(65) Prior Publication Data

US 2008/0048234 A1   Feb. 28, 2008

(30) Foreign Application Priority Data

Aug. 22, 2006   (JP)   .............................. 2006-225596

(51) Int. Cl.
    *H01L 27/108*   (2006.01)
(52) U.S. Cl. ....................... 257/303; 257/296; 257/301; 257/306; 257/309; 257/534; 257/E27.086; 257/E27.087; 257/E27.092
(58) Field of Classification Search ................. 257/301, 257/303, 296, 306, 309, 534, E27.086, E27.087
    See application file for complete search history.

(56) References Cited

U.S. PATENT DOCUMENTS

| 6,281,535 B1 * | 8/2001 | Ma et al. ..................... 257/295 |
| 6,503,796 B1 | 1/2003 | Tu |
| 6,720,232 B1 * | 4/2004 | Tu et al. ..................... 438/396 |
| 6,853,024 B1 * | 2/2005 | Tu .............................. 257/301 |
| 2006/0086960 A1 * | 4/2006 | Arai et al. .................... 257/303 |

FOREIGN PATENT DOCUMENTS

JP   2002-141424   5/2002

\* cited by examiner

*Primary Examiner*—Kenneth A Parker
*Assistant Examiner*—Yu Chen
(74) *Attorney, Agent, or Firm*—McDermott Will & Emery LLP

(57) ABSTRACT

A semiconductor memory device has a first interlayer insulating film formed on a semiconductor substrate and having a capacitor opening portion provided in the film, and a capacitance element formed over the bottom and sides of the capacitor opening portion and composed of a lower electrode, a capacitance insulating film, and an upper electrode. A bit-line contact plug is formed through the first interlayer insulating film. At least parts of respective upper edges of the lower electrode, the capacitance insulating film, and the upper electrode at a side facing the bit-line contact plug are located below the surface of the first interlayer insulating film, the lower electrode, the capacitance insulating film, and the upper electrode being located over the sides of the capacitor opening portion. The upper electrode is formed over only the bottom and sides of the capacitor opening portion.

16 Claims, 16 Drawing Sheets

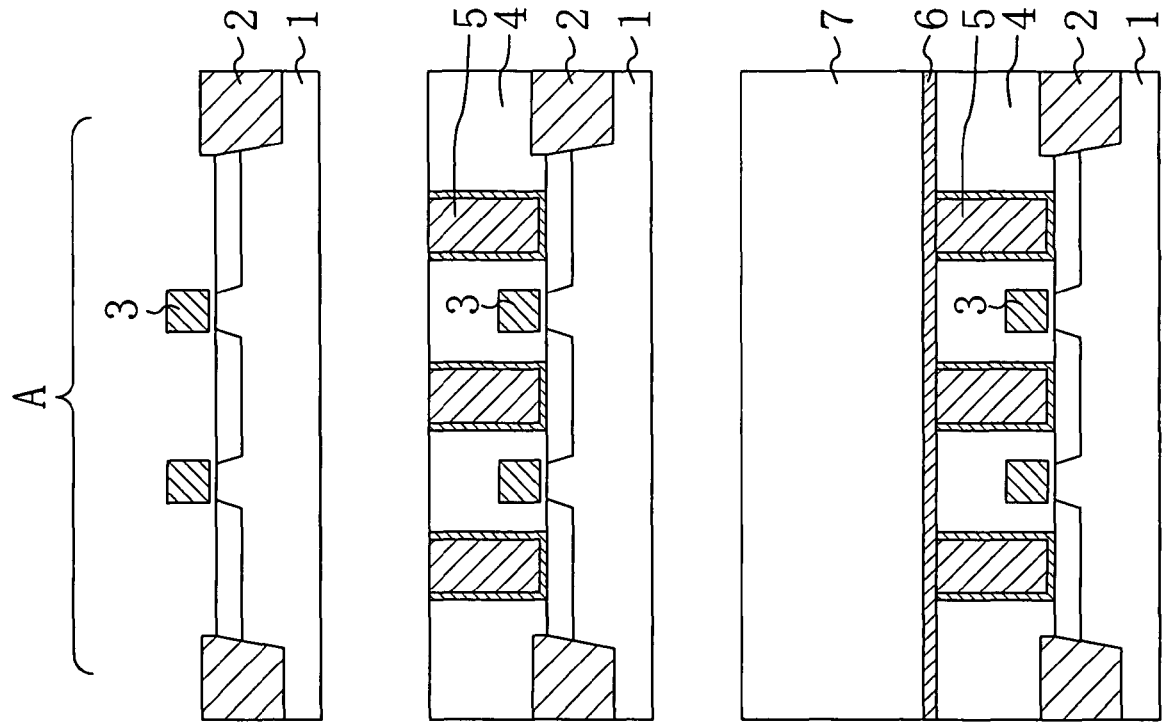

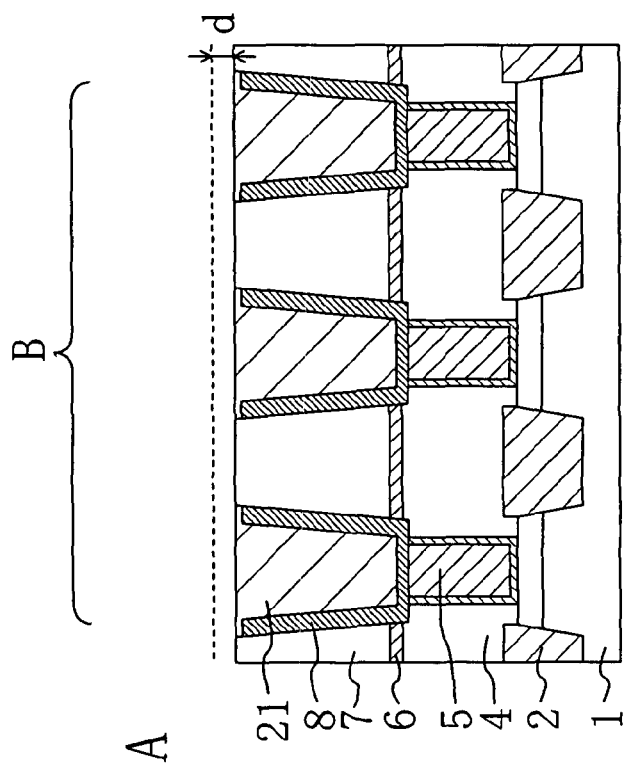
FIG. 6A
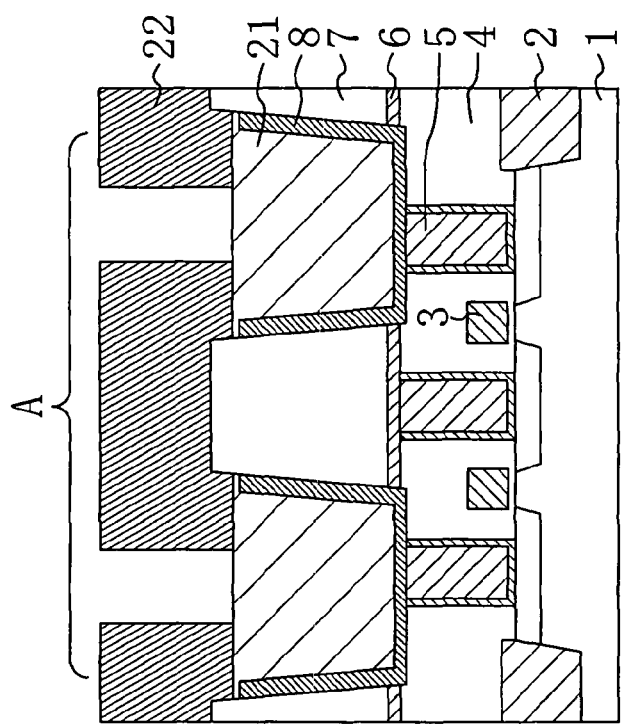
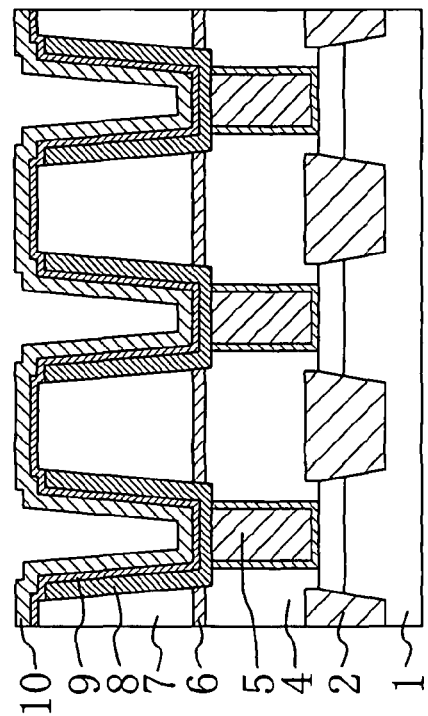
FIG. 6B
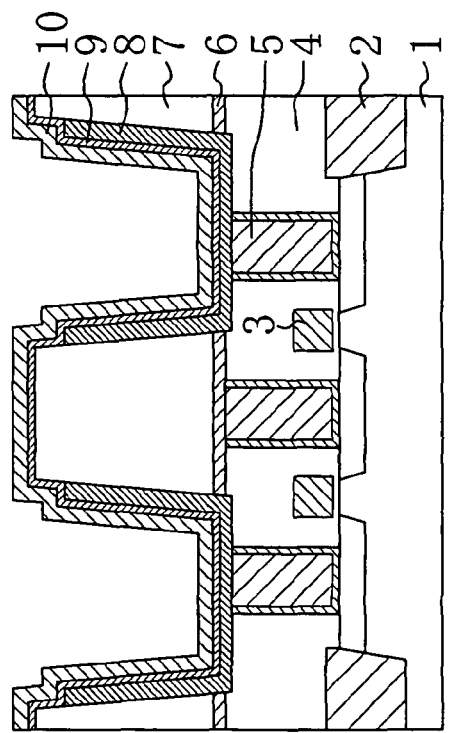

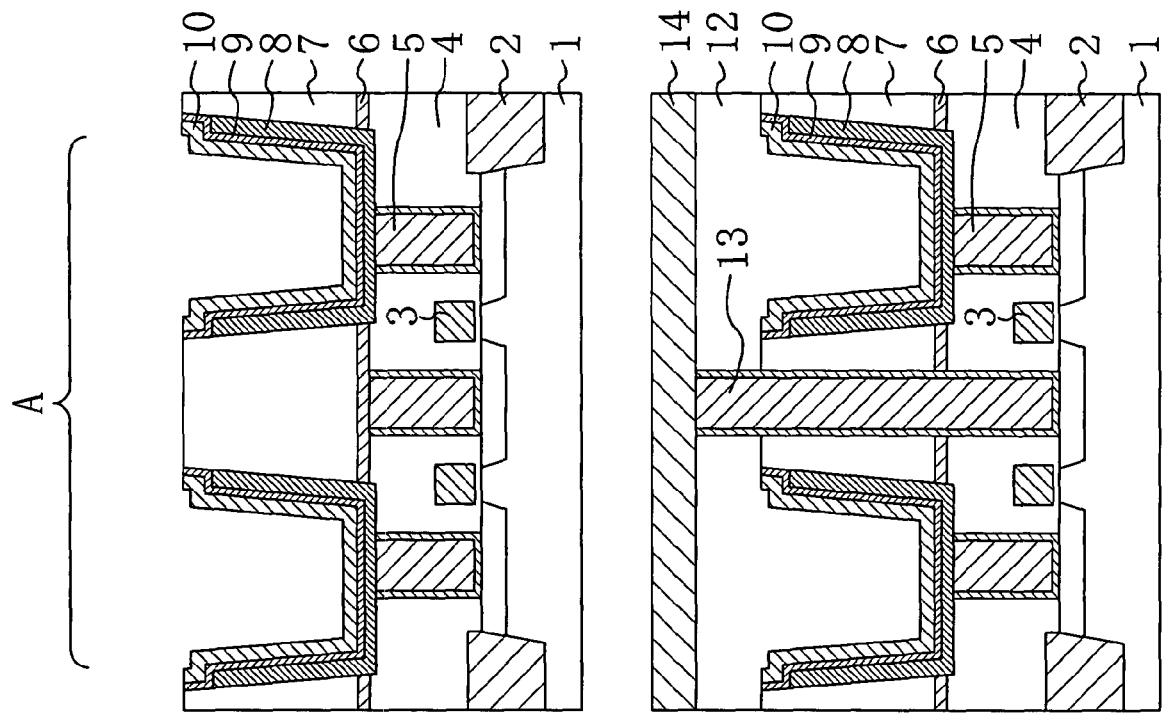
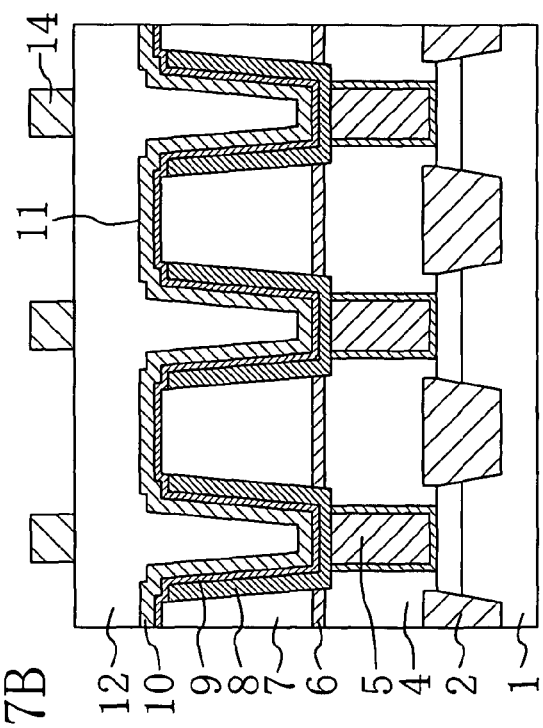
FIG. 7A
FIG. 7B

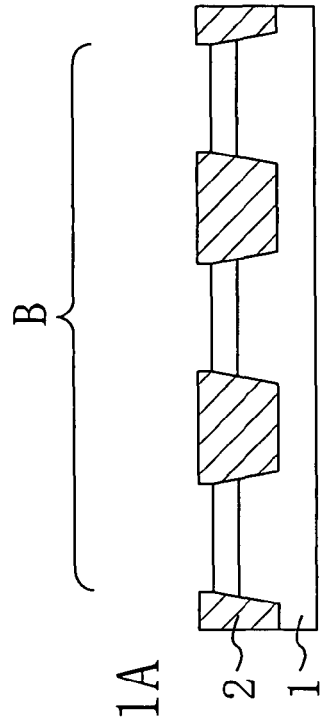
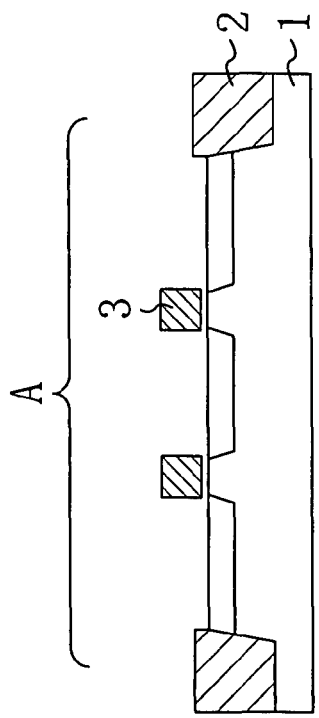
FIG. 11A
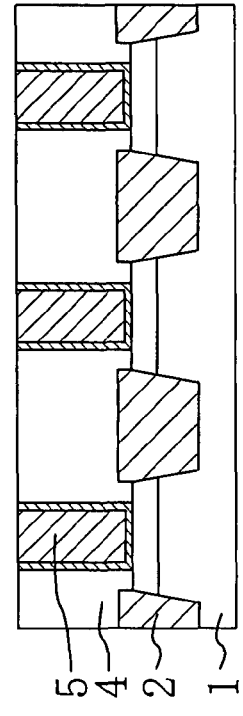
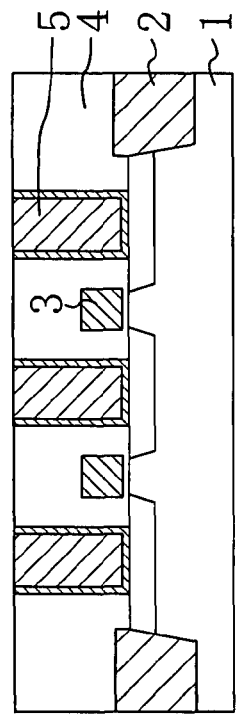
FIG. 11B
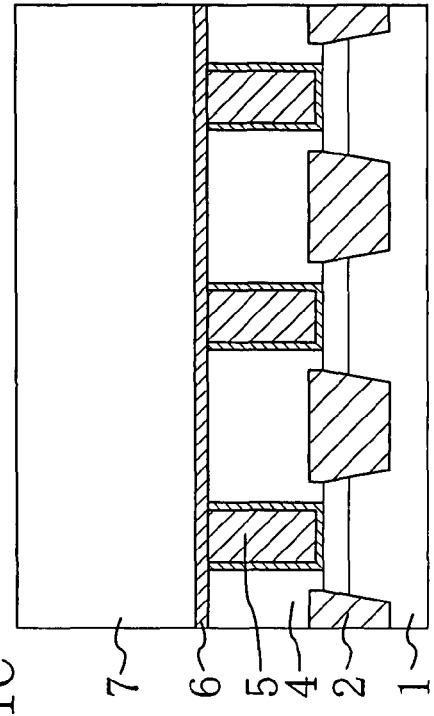
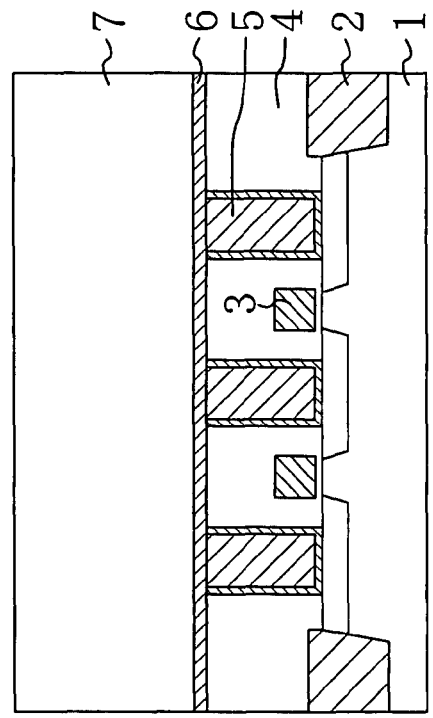
FIG. 11C

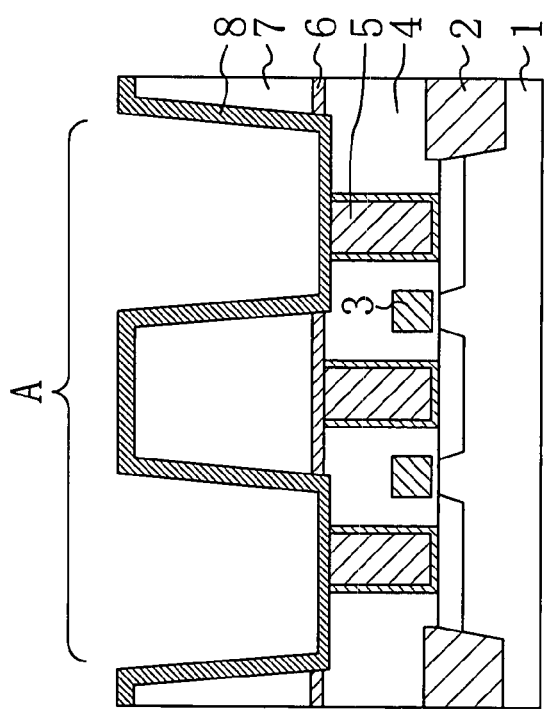
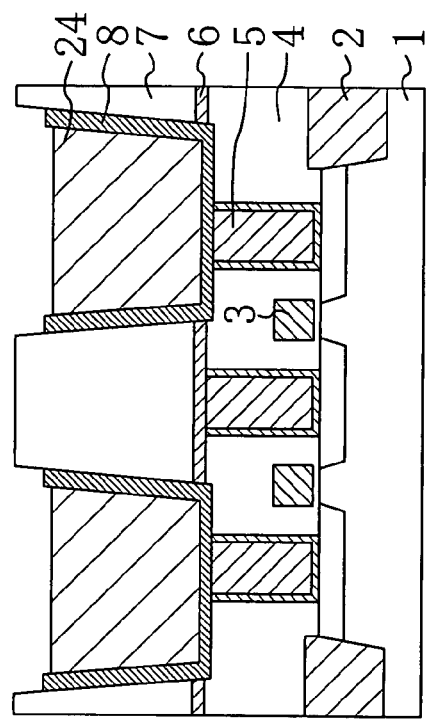
FIG. 12A
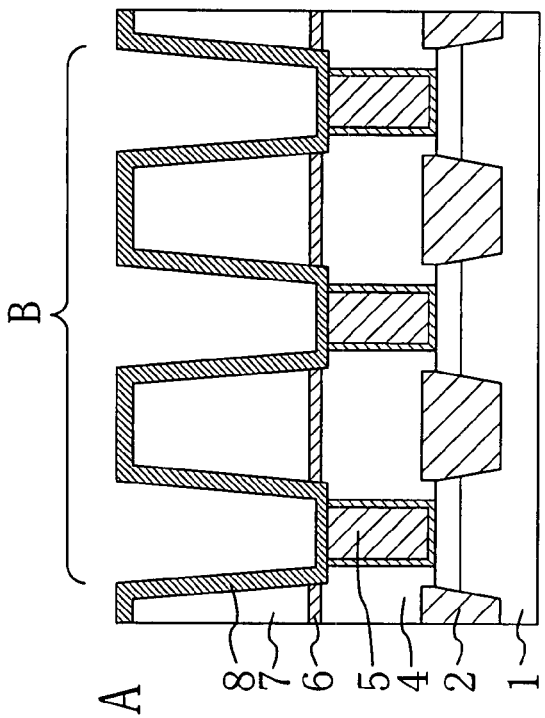
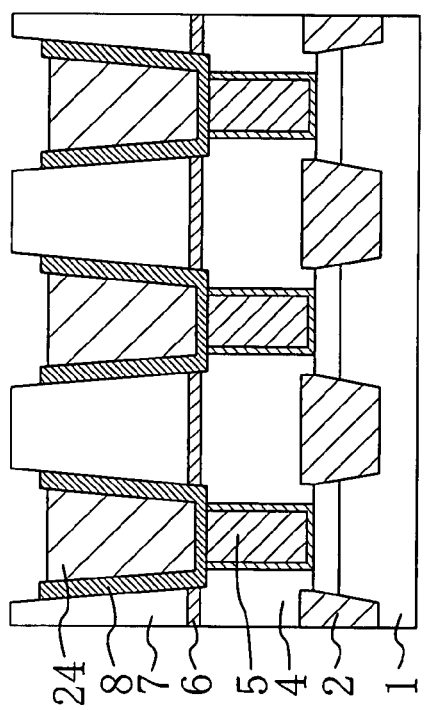
FIG. 12B

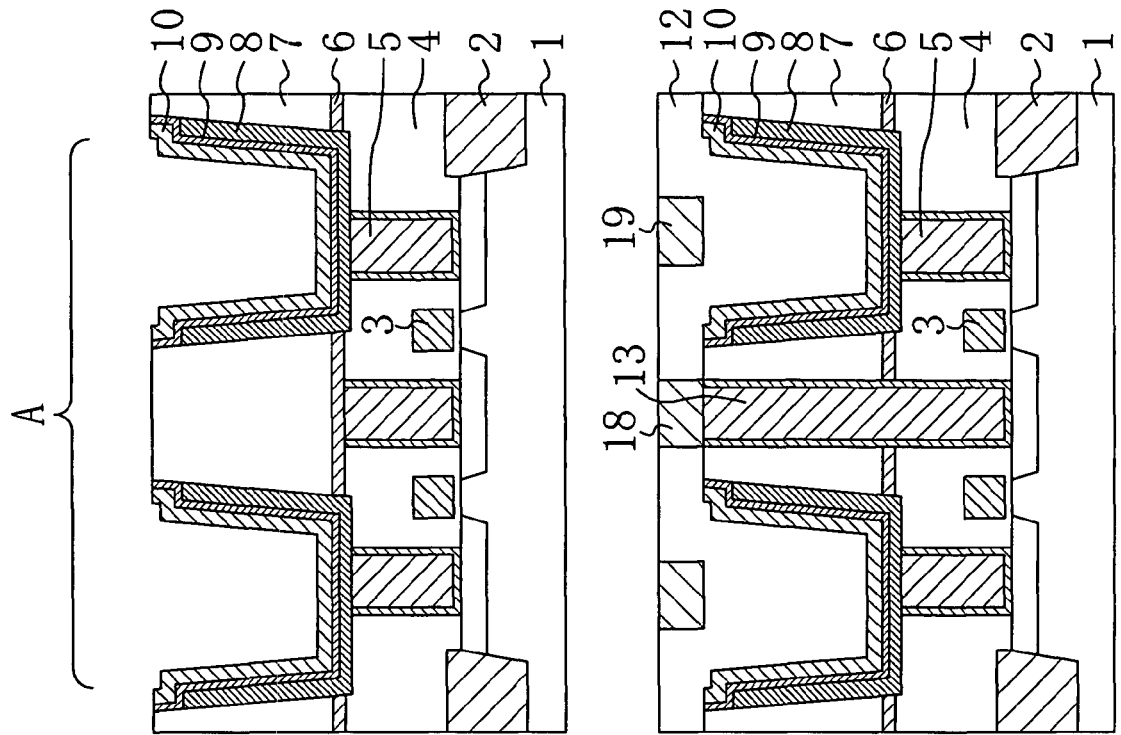
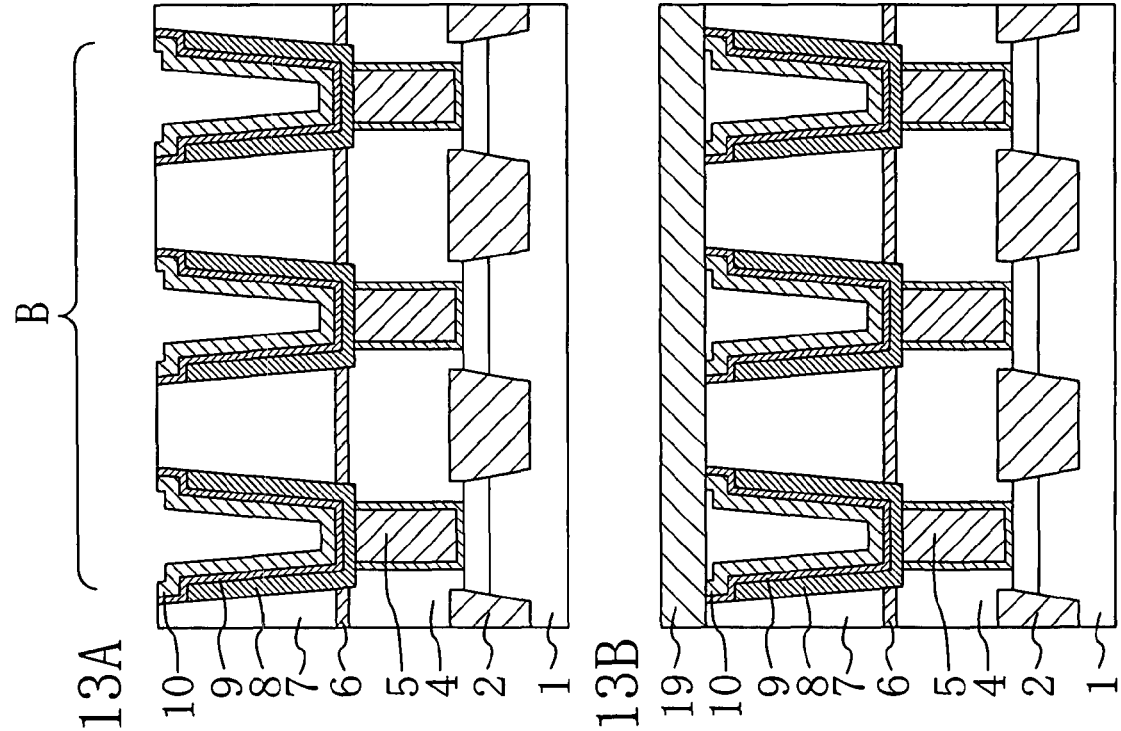

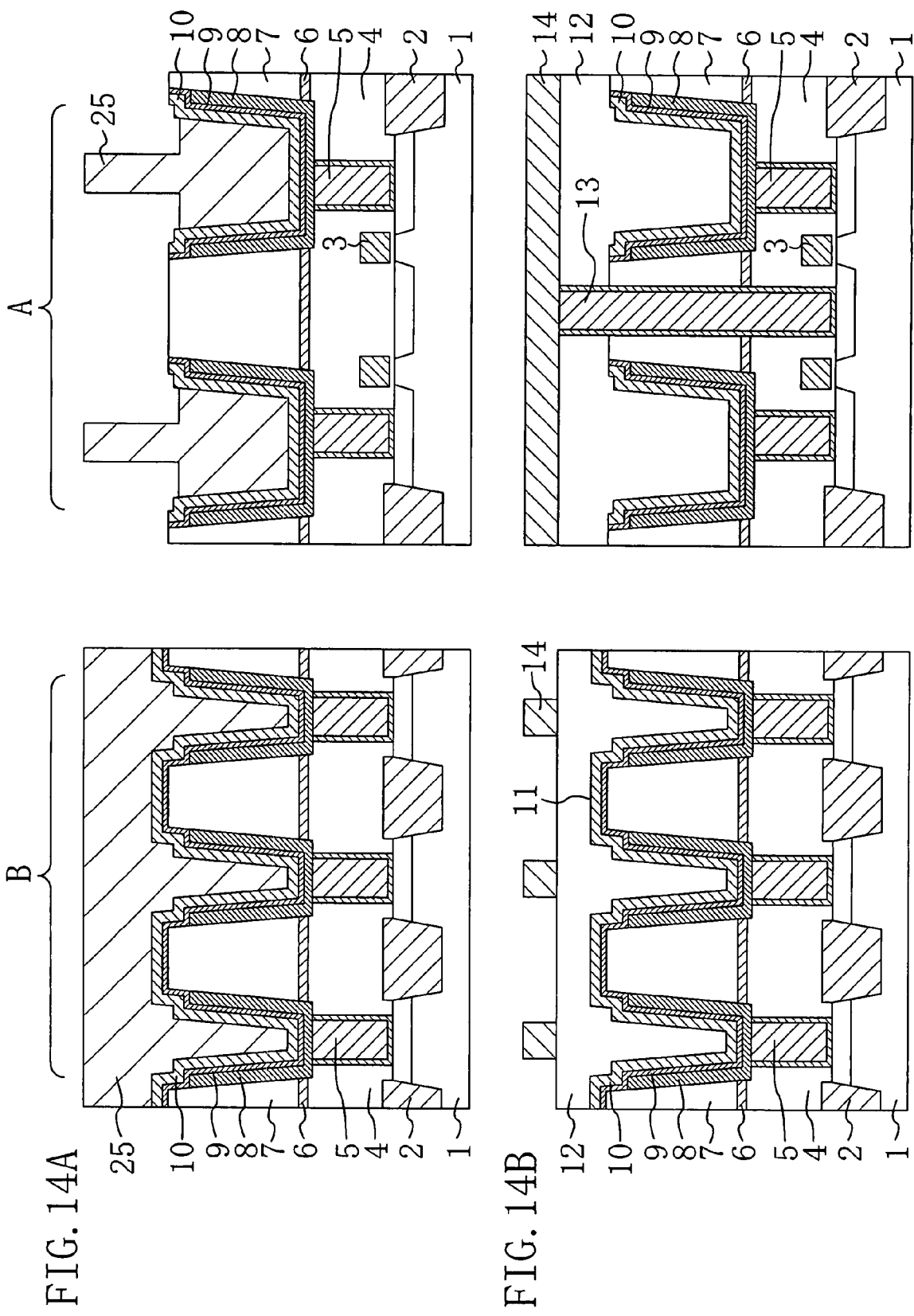

SEMICONDUCTOR MEMORY DEVICE AND METHOD FOR FABRICATING SAME

BACKGROUND OF THE INVENTION

1. Technical Field

The present invention relates to a semiconductor memory device such as DRAM and a method for fabricating the device.

2. Related Art

DRAM of the capacitor-under-bitline (CUB) structure, in which capacitance elements for charge storage are arranged under bit lines, uses concave-type capacitance electrodes. Use of concave-type capacitance electrodes for DRAM is said to be advantageous for refining in that the surface of an interlayer insulating film formed over the DRAM can be made flat.

The structure of a DRAM-embedded semiconductor device with conventional concave-type capacitance electrodes will be described below in conjunction with FIGS. 17A and 17B. FIG. 17A is a plan view of a conventional DRAM-embedded semiconductor device, showing the structure thereof. FIG. 17B is a cross section of the semiconductor device taken along the line XVIIb-XVIIb shown in FIG. 17A.

As shown in FIG. 17B, on a silicon substrate 101, a shallow trench isolation (STI) 102 is formed to surround a region in which a transistor is formed. Over the silicon substrate 101 is formed a gate electrode 103 across a gate insulating film (not shown). An interlayer insulating layer 104 is formed on the silicon substrate 101 and the gate electrode 103. A contact plug 105 is formed in the interlayer insulating film 104 to reach the silicon substrate 101. Over the interlayer insulating film 104 are formed a silicon nitride film 106 and an interlayer insulating film 107. A capacitance cell hole (capacitor opening portion 116) is formed through the interlayer insulating film 107 to reach the surface of the contact plug 105.

A capacitance element is composed of a lower electrode 108 covering the bottom and sides of the capacitor opening portion 116, a capacitance insulating film 109 covering the capacitance opening portion 116 and part of the interlayer insulating film 107, and an upper electrode 110 covering the upper surface of the capacitance insulating film 109. An interlayer insulating film 112 is formed on the upper electrode 110. A bit-line contact plug 113 is formed through the interlayer insulating films 112 and 107 to reach the contact plug 105. On the interlayer insulating film 112 is formed a bit line 114 to be connected to the bit-line contact plug 113.

The capacitance element of the semiconductor device shown in FIGS. 17A and 17B is formed in the following manner. First, the lower electrode 108 is formed on the bottom and sides of the capacitor opening portion 116, and thereafter the capacitance insulating film 109 and the upper electrode 110 are formed over the interlayer insulating film 107 including the capacitor opening portion 116. Then, the upper electrode 110 is etched using a resist mask, and an opening portion 115 for forming the bit-line contact plug 113 therethrough is formed through the upper electrode 110.

The opening portion 115 is provided while securing a predetermined margin a1 relative to the bit-line contact plug 113 and a predetermined margin a2 relative to a capacitor opening portion 116. That is, the predetermined margin a1 is set considering mis-alignment of a photo mask for forming the bit-line contact plug 113, and the predetermined margin a2 is set considering mis-alignment of a photo resist mask for forming the capacitor opening portion 116.

SUMMARY OF THE INVENTION

Although capacitance elements formed by the conventional fabrication method provide an improvement in refining of patterning because of lithography realized in short wavelength, the mis-alignment margins a1 and a2 have a smaller shrinkage rate than that of patterning. This makes the mis-alignment margins a1 and a2 account for a larger percentage of the cell size as refining makes the cell size smaller, resulting in a smaller percentage for the capacitor opening portion 116.

Additionally, DRAM with concave-type capacitance electrodes can only store memory charge in the capacitance portion provided inside the capacitor opening portion 116. This reduces storable memory charge as refining makes smaller the area of the capacitor opening portion 116, making it difficult to maintain the amount of memory charge required for memory operation.

In view of the foregoing problems, it is a major object of the present invention to provide a semiconductor memory device and a method for fabricating the same capable of maintaining the required capacitance for DRAM operation even when the cell size is made fine.

A semiconductor memory device according to the present invention includes: a first interlayer insulating film formed on a semiconductor substrate and having a capacitor opening portion provided in the first interlayer insulating film; and a capacitance element formed over the bottom and sides of the capacitor opening portion, the capacitance element being composed of a lower electrode, a capacitance insulating film, and an upper electrode. A bit-line contact plug is formed through the first interlayer insulating film. At least parts of respective upper edges of the lower electrode, the capacitance insulating film, and the upper electrode at a side facing the bit-line contact plug are located below the surface of the first interlayer insulating film, the lower electrode, the capacitance insulating film, and the upper electrode being located over the sides of the capacitor opening portion.

In this configuration, the upper electrode is not located over the first interlayer insulating film between the capacitor opening portion and the bit-line contact plug; the upper electrode is formed only over the bottom and sizes of the capacitor opening portion. This eliminates the conventional need for the margin a2 provided considering mis-alignment between the capacitor opening potion and the opening portion 115, which is for forming the bit-line contact plug 113 therethrough. Thus, the capacitance is enlarged by an area corresponding to the conventionally secured mis-alignment margin a2 while keeping the cell size constant. This realizes a semiconductor memory device capable of maintaining the required capacitance for DRAM operation even when the cell size is made fine.

In one preferred embodiment, the upper edge of the lower electrode formed on the sides of the capacitor opening portion is located below the surface of the first interlayer insulating film by a depth greater than the thickness of the capacitance insulating film. The upper edge of the lower electrode formed on the sides of the capacitor opening portion is covered with the capacitance insulating film and the upper electrode.

In one preferred embodiment, parts of upper electrodes formed over the sides of adjacent capacitor opening portions are extended over the first interlayer insulating film thereby electrically connecting the upper electrodes at extended portions thereof.

In one preferred embodiment, the extended portions of the upper electrodes over the first interlayer insulating film are formed in a ditch portion formed on the surface of the first interlayer insulating film.

The electrically connected upper electrodes are preferably connected to plate potential.

The extended portions of the upper electrodes over the first interlayer insulating film each may be composed of a wiring layer made of a material different from a material of the upper electrodes.

A method for fabricating a semiconductor memory device according to the present invention includes: (a) forming a first interlayer insulating film on a semiconductor substrate and forming a capacitor opening portion in the first interlayer insulating film, the capacitor opening portion being for forming a capacitance element thereover; (b) selectively forming a lower electrode on a bottom and sides of the capacitor opening portion, the lower electrode being made of a first conductive film; (c) forming an insulating film and a second conductive film over the first interlayer insulating film and the lower electrode, the insulating film being for forming a capacitance insulating film, the second conductive film being for forming an upper electrode; (d) selectively removing the insulating film and the second conductive film formed over the first interlayer insulating film thereby forming the capacitance insulating film and the upper electrode; and (e) forming a second interlayer insulating film over the first interlayer insulating film and the upper electrode, and forming a bit-line contact plug through the first and the second interlayer insulating films. Step (d) includes selectively removing part of each of the capacitance insulating film and the second conductive film formed over the first interlayer insulating film, the part being at least at a side facing the bit-line contact plug.

In one preferred embodiment, the method further includes, after step (b) and before step (c), selectively etching a part of a surface of the first interlayer insulating film thereby forming a ditch portion on the surface of the first interlayer insulating film. Step (d) includes allowing part of the insulating film and the second conductive film formed over the first interlayer insulating film to remain in the ditch portion, the ditch portion being formed on the surface of the first interlayer insulating film.

In one preferred embodiment, step (b) includes locating an upper edge of the lower electrode formed on the sides of the capacitor opening portion below the surface of the first interlayer insulating film by a depth greater than the thickness of the capacitance insulating film.

In one preferred embodiment, step (b) includes: (b1) forming a first conductive film on the first interlayer insulating film including the capacitor opening portion, the first conductive film being for forming the lower electrode; (b2) selectively burying a photo resist in the capacitor opening portion; and (b3) etching the first conductive film formed on the first interlayer insulating film using the photo resist as a mask thereby removing the first conductive film.

In one preferred embodiment, step (d) includes polishing the insulating film and the second conductive film formed over the first interlayer insulating film until the surface of the first interlayer insulating film is exposed.

Step (d) may include: (d1) selectively burying a photo resist in the capacitor opening portion; and (d2) etching the insulating film and the second conductive film formed over the first interlayer insulating film using the photo resist as a mask thereby removing the insulating film and the second conductive film.

Sub-step (d1) preferably includes forming the photo resist also on the first interlayer insulating film located between adjacent capacitor opening portions, the photo resist being formed in a line form. Sub-step (d2) preferably includes allowing part of the second conductive film located under the line-form photo resist to remain on the first interlayer insulating film, whereby the remaining part of the second conductive film provides an electrical connection between upper electrodes formed over adjacent capacitor opening portions.

BRIEF DESCRIPTION OF THE DRAWINGS

FIGS. 4 through 7 are cross sectional views of the semiconductor memory device according to the first embodiment of the present invention, showing the process of fabricating the semiconductor memory device.

FIGS. 11A through 13B are cross sectional views of the semiconductor memory device according to the second embodiment of the present invention, showing the process of fabricating the semiconductor memory device.

FIGS. 14A and 14B are cross sectional views of a semiconductor memory device according to a third embodiment of the present invention, showing the process of fabricating the semiconductor memory device.

DESCRIPTION OF THE PREFERRED EMBODIMENTS

Figure 1:
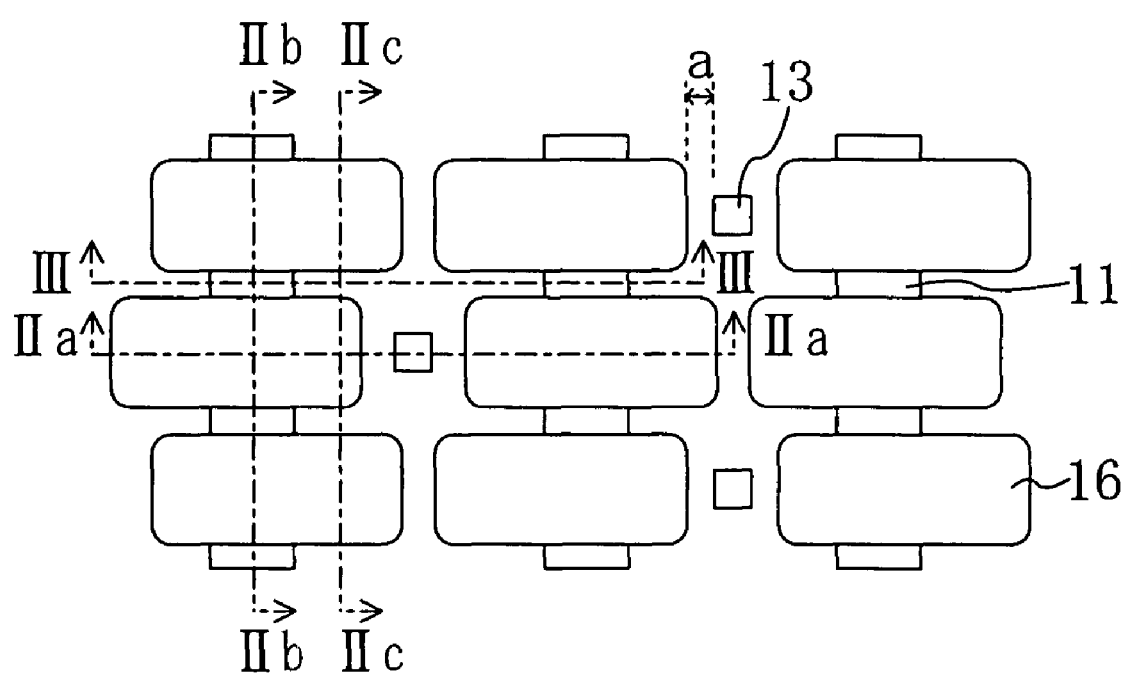
FIG. 1 is a plan view of a semiconductor memory device according to a first embodiment of the present invention, showing the configuration of the device.

Embodiments of the present invention will be described below in conjunction with the drawings. For simplicity of description, constituents with substantially identical functions will be denoted by identical reference numerals. It should be noted that the present invention will not be limited by the embodiments described below.

First Embodiment

Figure 2A:
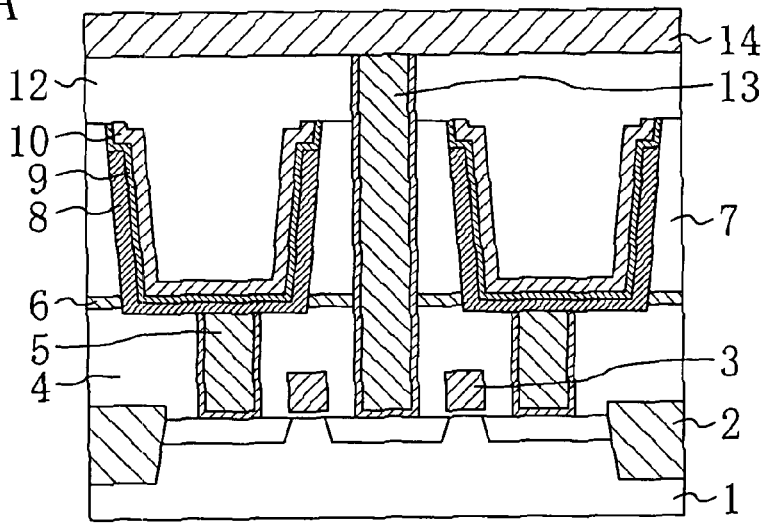
FIG. 2A is a cross sectional view of the semiconductor memory device taken along the line IIa-IIa shown in FIG. 1.

FIG. 1 is a plan view of a semiconductor memory device of the CUB structure according to the first embodiment. FIG. 2A is a cross sectional view of the device taken along the line IIa-IIa shown in FIG. 1, FIG. 2B is a cross sectional view of the device taken along the line IIb-IIb shown in FIG. 1, FIG. 2C is a cross sectional view of the device taken along the line IIc-IIc shown in FIG. 1, and FIG. 3 is a cross sectional view of the device taken along the line III-III shown in FIG. 1.

As shown in FIGS. 1 and 2A, the semiconductor memory device according to this embodiment has: a capacitor opening portion 16 provided in a first interlayer insulating film 7 formed on a semiconductor substrate 1; and a capacitance element composed of a lower electrode 8, a capacitance insulating film 9, and an upper electrode 10, which are formed over the bottom and sides of the capacitor opening portion. Through the first interlayer insulating film 7 is formed a bit-line contact plug 13. At least parts of respective upper edges of the lower electrode 8, the capacitance insulating film 9, and the upper electrode 10 at the side facing the bit-line contact plug 13 are located below the surface of the first interlayer insulating film 7, the lower electrode 8, the capacitance insulating film 9, and the upper electrode 10 being located over the sides of the capacitor opening portion 16. That is, the upper electrode 10 does not exist over the first interlayer insulating film 7 between the capacitor opening portion 16 and the bit-line contact plug 13; the upper electrode 10 is provided only over the bottom and sides of the capacitor opening portion 16. Therefore, what needs to secured during formation of the bit-line contact plug 13 is only a mis-alignment margin "a" relative to the capacitor opening portion 16, as shown in FIG. 1.

By a method described later, the upper edge of the lower electrode 8, which is formed on the sides of the capacitor opening portion 16, is located below the surface of the first interlayer insulating film 7 by a depth greater than the thickness of the capacitance insulating film 9. This causes the upper edge of the lower electrode 8, which is formed on the sides of the capacitor opening portion 16, to be covered with the capacitance insulating film 9 and the upper electrode 10.

Figure 2B:
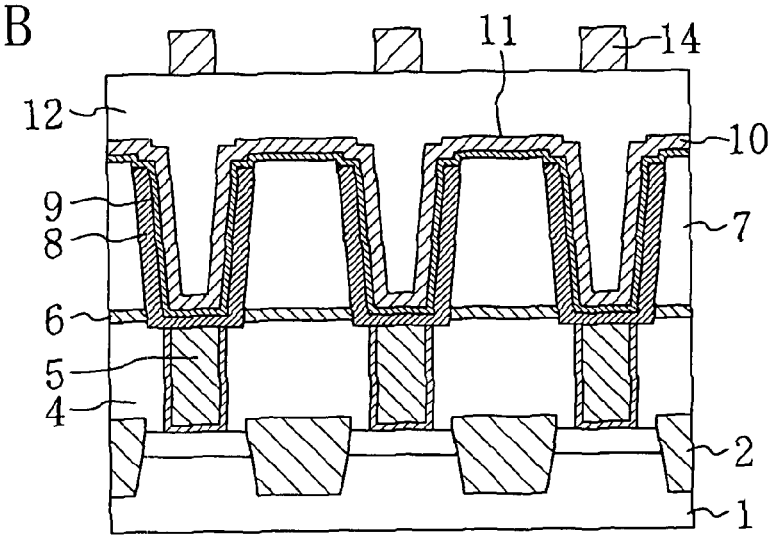
FIG. 2B is a cross sectional view of the semiconductor memory device taken along the line IIb-IIb shown in FIG. 1.
Figure 2C:
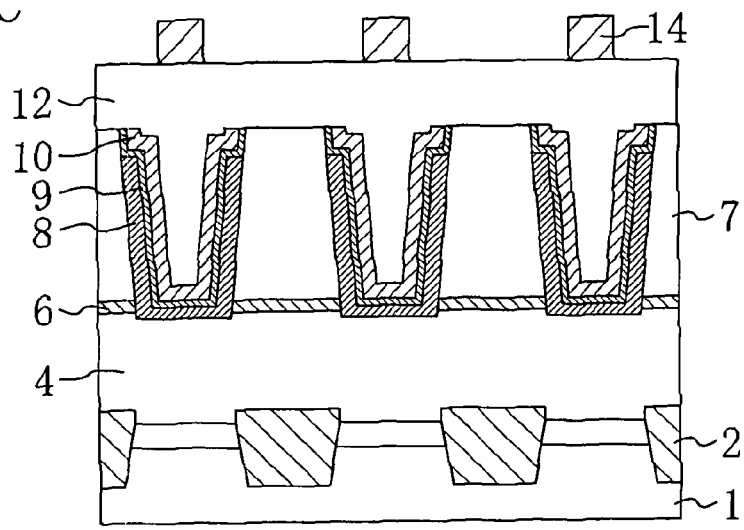
FIG. 2C is a cross sectional view of the semiconductor memory device taken along the line IIc-IIc shown in FIG. 1.
Figure 3:
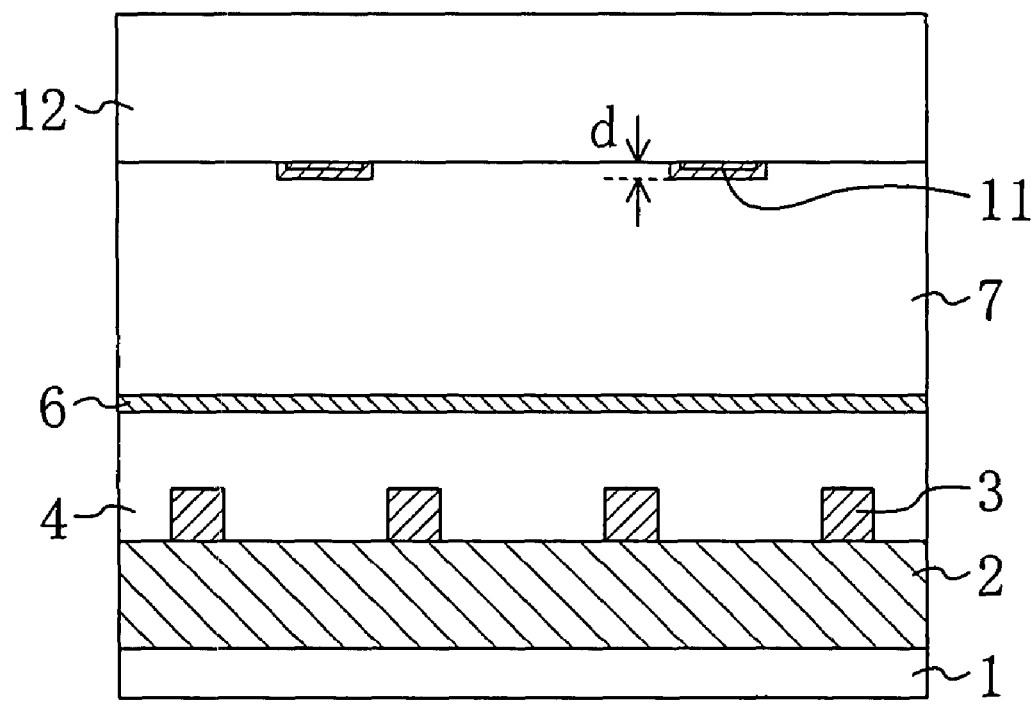
FIG. 3 is a cross sectional view of the semiconductor memory device taken along the line III-III shown in FIG. 1.

As shown in FIGS. 2B and 3, parts of upper electrodes 10 formed over the sides of adjacent capacitor opening portions 16 are extended over the first interlayer insulating film 7 thereby electrically connecting the upper electrodes 10 at the extended portions (upper electrode wiring 11) thereof.

The upper electrode wiring 11, which results from extension of upper electrodes 10 over the first interlayer insulating film 7, is formed by a method described later in a ditch portion with a depth of d, which is formed on the surface of the first interlayer insulating film 7. The upper electrodes 10, which are electrically connected to each other in the above manner, are connected to plate potential.

Above the first interlayer insulating film 7 is formed a second interlayer insulating film 12 for covering the capacitance element; and on the second interlayer insulating film 12 is formed a bit line 14 connected to the bit-line contact plug 13.

On the semiconductor substrate 1 is formed an MIS transistor, and over the semiconductor substrate 1 is formed a third interlayer insulating layer 4 for covering the MIS transistor. The lower electrode 8 of the capacitance element is connected to one of a source region and a drain region of the MIS transistor via a first contact plug 5 formed in the third interlayer insulating film 4. The bit-line contact plug 13 is connected to the other one of the source region and the drain region of the MIS transistor via a second contact plug 5 formed in the third interlayer insulating film 4.

Next, a method for fabricating the semiconductor memory device according to this embodiment will be described in conjunction with cross sectional views of the device shown in FIGS. 4A through 7B. In the figures, the region A denotes a cross section of the device taken along the line IIa-IIa in FIG. 1, and the region B denotes a cross section of the device taken along the line IIb-IIb in FIG. 1.

Referring to FIG. 4A, an element isolating oxide film 2 made of a silicon oxide film is formed on a silicon substrate 1 by a method known in the art. Then, a gate electrode 3 is formed above the silicon substrate 1 via a gate insulating film (not shown) made of a silicon oxide film of, for example, 5 nm thick.

Next, referring to FIG. 4B, an interlayer insulating film (third interlayer insulating film) 4 is accumulated, after which a contact plug 5 made of conductive material is formed through the interlayer insulating film 4 to come into contact with an active region.

Next, referring to FIG. 4C, a silicon nitride film 6 and an interlayer insulating film (first interlayer insulating film) 7 are accumulated over the interlayer insulating film 4.

Figure 5A:
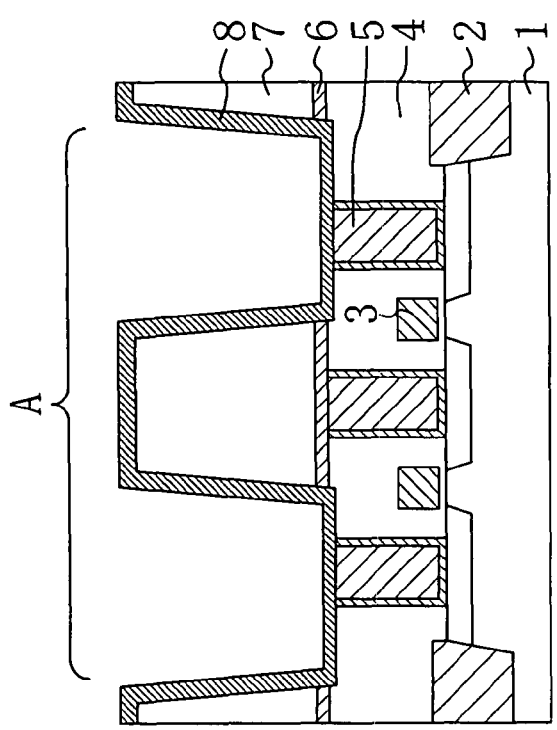

Next, referring to FIG. 5A, a capacitor opening portion is formed through the interlayer insulating film 7 and the silicon nitride film 6 to reach the upper surface of the contact plug 5. Then, a first conductive film 8 serving as a lower electrode is accumulated on the interlayer insulating film 7 that includes the capacitor opening portion.

Figure 5B:
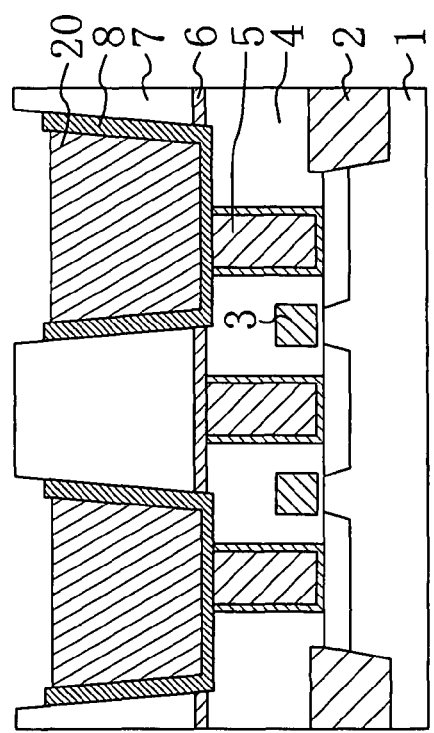

Next, referring to FIG. 5B, a photo resist 20 is buried in the capacitor opening portion, and the first conductive film 8 on the interlayer insulating film 7 is removed by anisotropic etching, thus forming the lower electrode 8. The photo resist 20 in the capacitor opening portion is formed in such a manner that a photo resist is applied beyond the upper surface of the interlayer insulating film 7, followed by removal of the photo resist on the interlayer insulating film 7 by whole image exposure. In the step of removing the lower electrode 8 by dry etching, the etching time is set so that the upper edge of the lower electrode 8 is located below the interlayer insulating film 7 by a depth greater than at least the thickness of the capacitance insulating film.

Figure 8:
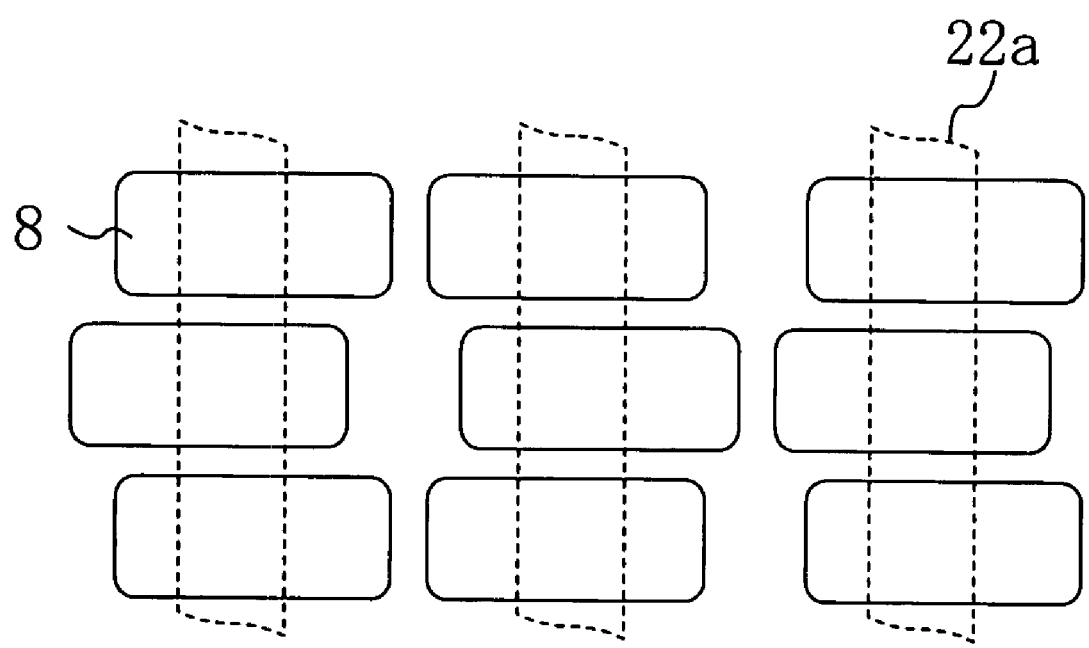
FIG. 8 is a plan view of a photo resist pattern for forming a ditch portion on the interlayer insulating layer, in the first embodiment of the present invention.

Next, referring to FIG. 6A, an organic buried material 21 is buried in the capacitor opening portion, followed by etching of part of the surface of the interlayer insulating film 7 using, as a mask, a resist pattern 22 partially provided with opening regions, thus forming a ditch portion with a depth of d. An opening region 22a of the resist pattern 22 is formed to connect capacitor opening portions on which lower electrodes 8 are formed, as shown in FIG. 8.

Next, referring to FIG. 6B, the organic buried material 21 and the resist 22 are removed, followed by accumulation of an insulating film 9 for use in forming a capacitance insulating film and a second conductive film 10 for use in forming an upper electrode.

Next, referring to FIG. 7A, the insulating film 9 and the second conductive film 10 over the interlayer insulating film 7 are removed by CMP (Chemical Mechanical Polishing) until the interlayer insulating film 7 is exposed, thus forming in the capacitor opening portion a capacitance insulating film 9 serving as a capacitor and an upper electrode 10. Here the capacitance insulating film 9 and the upper electrode 10 remain in the ditch portion formed on the surface of the interlayer insulating film 7, and upper electrodes 10 formed on the sides of adjacent capacitor opening portions are electrically connected to each other at an upper electrode wiring 11 formed in the ditch portion.

Finally, referring to FIG. 7B, an interlayer insulating film (second interlayer insulating film) 12 is accumulated over the interlayer insulating film 7 as if to fill in the capacitor opening portion, followed by formation of a bit-line contact plug 13 that penetrates through the interlayer insulating films 7 and 12 and the silicon nitride film 6 to be connected to the contact plug 5. Then, a metal wiring 14 serving as a bit line is formed on the interlayer insulating film 12, followed by formation of an upper layer wiring by a technique known in the art. Thus, a semiconductor memory device of the CUB structure is complete.

The CUB structure in this embodiment is as shown in FIG. 1, where the capacitor opening portion 16 and the bit-line contact plug 13 are formed with a predetermined margin "a" secured in between. The margin a is set considering mis-alignment of a photo resist mask for forming the capacitor opening portion 16 and the bit-line contact plug 13.

Figure 17A:
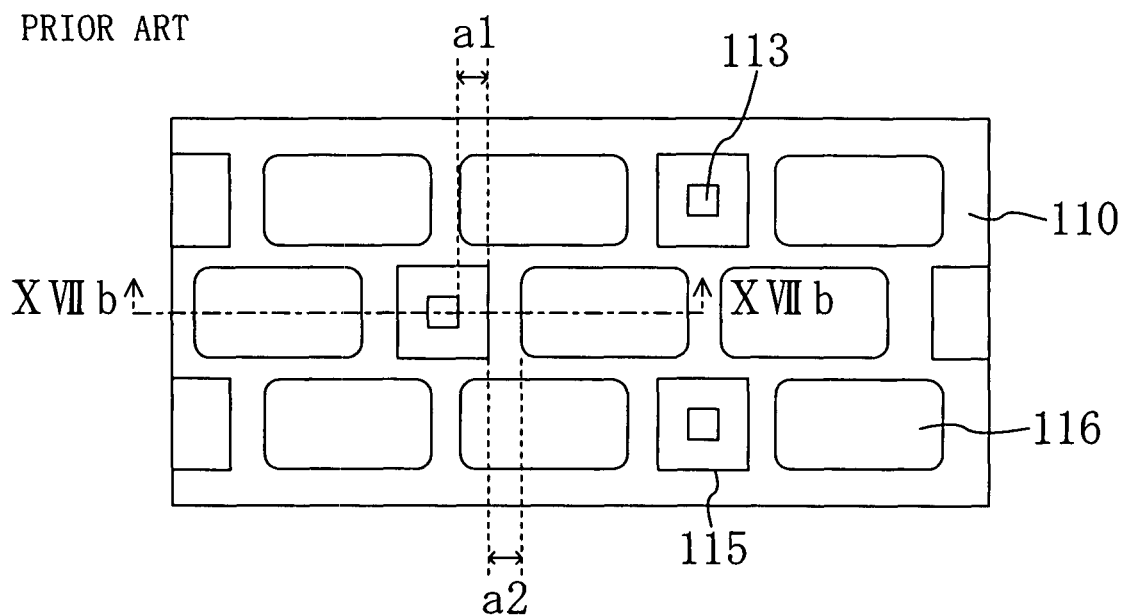
FIG. 17A is a plan view of a conventional semiconductor memory device, showing the structure thereof.
Figure 17B:
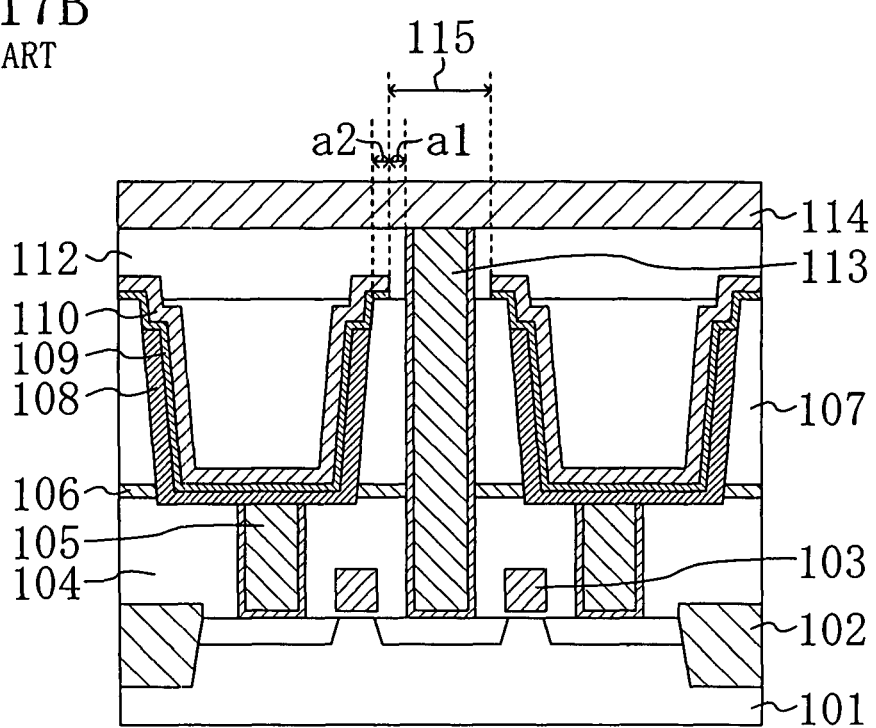
FIG. 17B is a cross sectional view of the conventional semiconductor memory device taken along the line XVIIb-XVIIb shown in FIG. 17A.

As shown in FIG. 17A, the conventional CUB structure required two mis-alignment margins, i.e., a1+a2, to be secured between the capacitor opening portion 16 and the bit-line contact plug 13. While the size of the mis-alignment margins fluctuates depending on lithography and process conditions, the amount of fluctuation is small enough to make possible the assumption that a=a1=a2, which means that the mis-alignment margin a of this embodiment can be made approximately half as small as the conventional mis-alignment margin 2a. That is, the capacitor opening portion 16 of this embodiment can be made larger than conventional ones by the length a, provided that the memory cell size is constant. This results in an increased volume for the capacitor opening portion 16, thereby preventing mal-operation of DRAM that is otherwise caused by a shortage of stored charge.

It is noted that the step shown in FIG. 6A according to this embodiment may omit formation of a ditch portion on part of the surface of the interlayer insulating film 7. Although in this case the potential at the upper electrode 10 of each memory cell is not fixed, the DRAM is still operable by controlling the amount of stored charge, a leak property, etc.

Figure 9A:
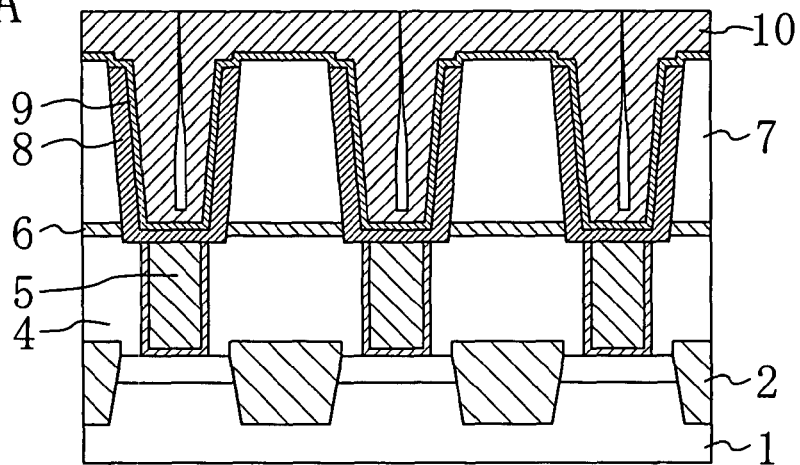
FIGS. 9A through 9C are cross sectional views of the semiconductor memory device, showing a modified example of the fabrication method according to the first embodiment of the present invention.
Figure 9B:
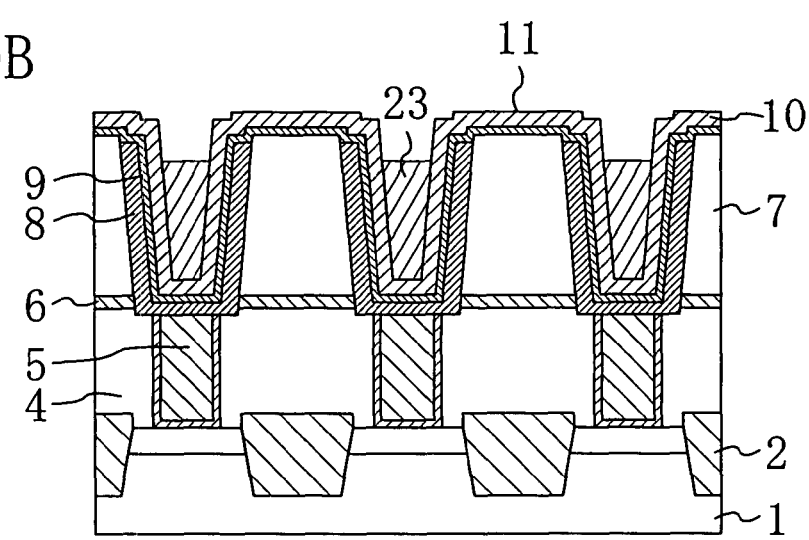
Figure 9C:
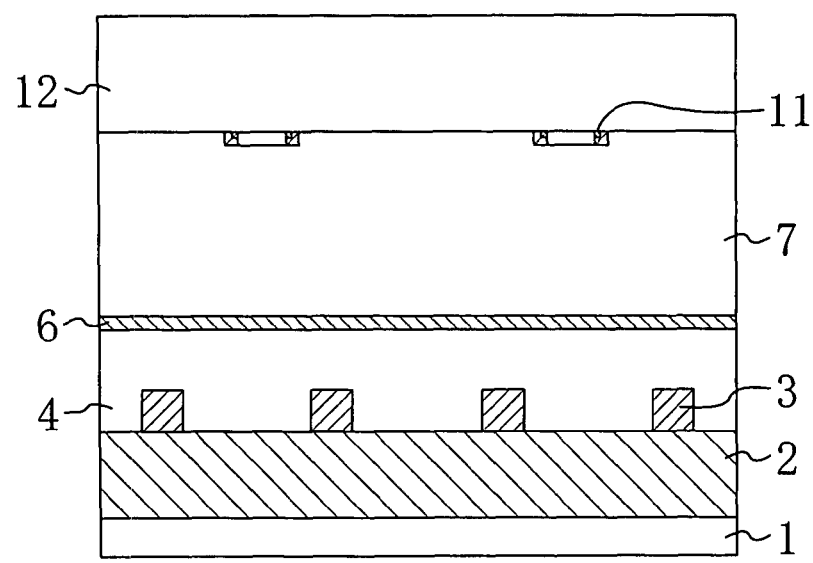

While in the step shown in FIG. 7A CMP is used for removing the capacitance insulating film 9 and the upper electrode 10 over the interlayer insulating film 7, dry etching may be used for the removal. In this case, protection is needed to prevent etching of the upper electrode 10 formed over the bottom of the capacitor opening portion 16. For example, as shown in FIG. 9A, the upper electrode 10 formed over the bottom of the capacitor opening portion 16 can be protected by filling the capacitor opening portion 16 with the material of the upper electrode 10. Alternatively, as shown in FIG. 9B, the upper electrode 10 formed over the bottom of the capacitor opening portion 16 can be protected by filling the capacitor opening portion 16 with the photo resist 23. Here, as shown in FIG. 9C, it is possible that the upper electrode wiring 11 remains only partially in the ditch portion, which is formed on the surface of the interlayer insulating film 7 to connect capacitor opening portions 16. Even if the upper electrode wiring 11 becomes highly resistant, however, the DRAM will have no operational problems because the potential at the upper electrode 10 is usually kept constant.

Second Embodiment

Figure 10A:
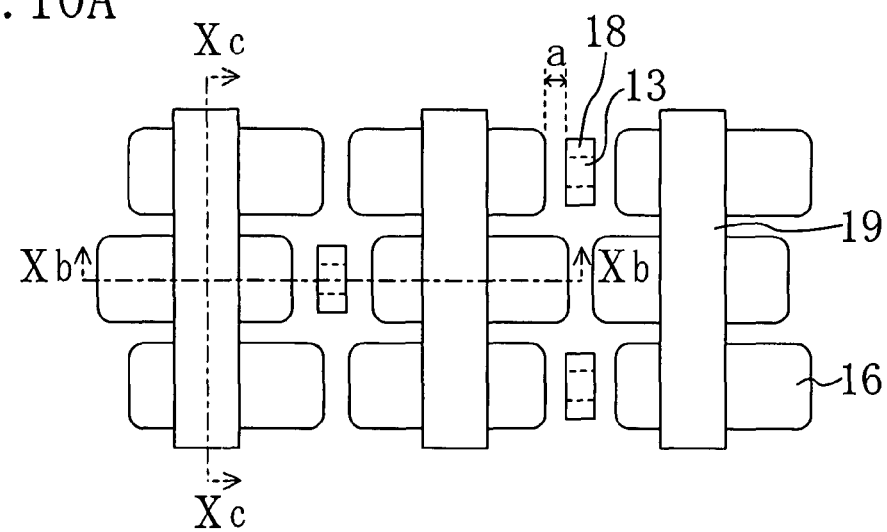
FIG. 10A is a plan view of a semiconductor memory device according to a second embodiment of the present invention, showing the structure of the semiconductor memory device.
Figure 10B:
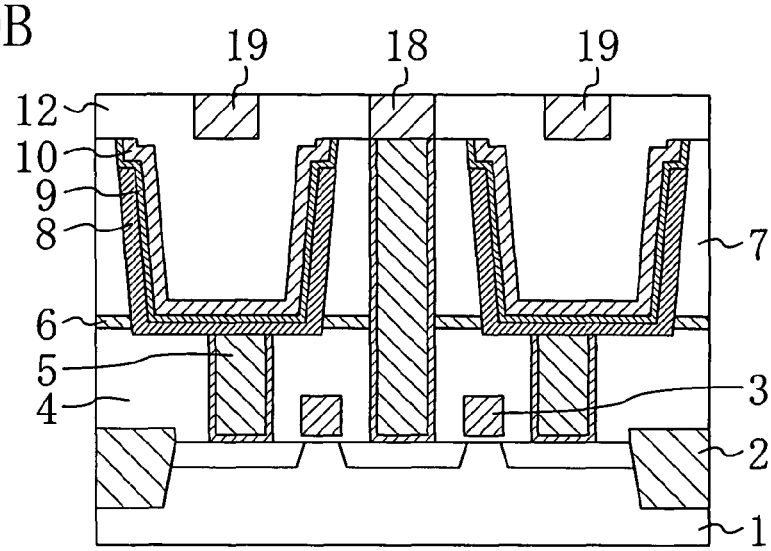
FIG. 10B is a cross sectional view of the semiconductor memory device taken along the line Xb-Xb shown in FIG. 10A.
Figure 10C:
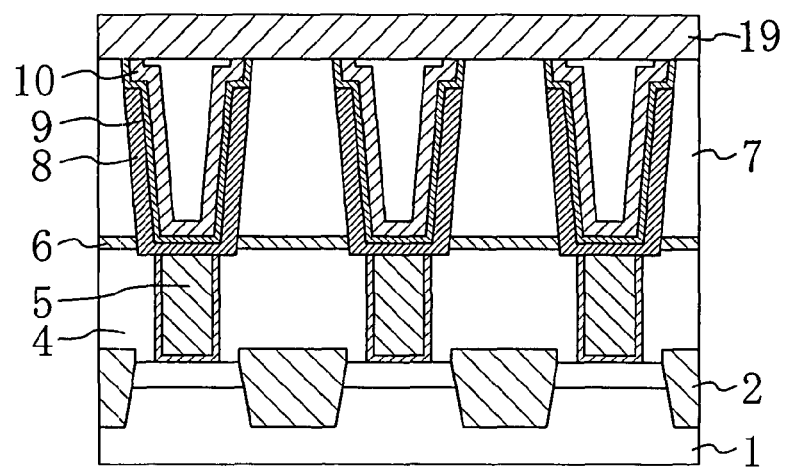
FIG. 10C is a cross sectional view of the semiconductor memory device taken along the line Xc-Xc shown in FIG. 10A.
Figure 15:
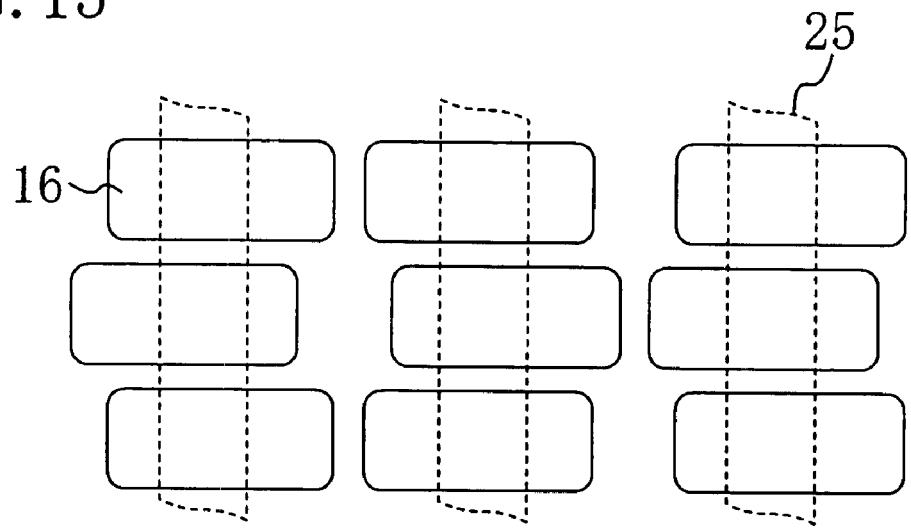
FIG. 15 is a plan view of a photo resist pattern for forming an upper electrode in the capacitor opening portion, in the third embodiment of the present invention.

FIGS. 10A through 10C are views of a semiconductor memory device of the CUB structure according a second embodiment, showing the structure of the device. FIG. 10A is a plan view of the device, FIG. 10B is a cross sectional view of the device taken along the line Xb-Xb shown in FIG. 10A., and FIG. 10C is a cross sectional view of the device taken along the line Xc-Xc shown in FIG. 10A.

A method for fabricating the semiconductor memory device according to this embodiment will be described in conjunction with cross sectional views of the device shown in FIGS. 10A through 13C. In the figures, the region A denotes a cross section of the device taken along the line Xb-Xb in FIG. 10A, and the region B denotes a cross section of the device taken along the line Xc-Xc in FIG. 10A. Steps that the first and second embodiments have in common will not be described in detail.

First, referring to FIG. 11A, an element isolating oxide film 2 made of a silicon oxide film is formed on a silicon substrate 1 by a method known in the art. Then, a gate electrode 3 is formed above the silicon substrate 1 via a gate insulating film (not shown) made of a silicon oxide film.

Next, referring to FIG. 11B, an interlayer insulating film (third interlayer insulating film) 4 is accumulated, after which a contact plug 5 made of conductive material is formed through the interlayer insulating film 4 to come into contact with an active region.

Next, referring to FIG. 11C, a silicon nitride film 6 and an interlayer insulating film (first interlayer insulating film) 7 are formed over the interlayer insulating film 4.

Next, referring to FIG. 12A, a capacitor opening portion is formed through the interlayer insulating film 7 and the silicon nitride film 6 to reach the upper surface of the contact plug 5. Then, a first conductive film 8 serving as a lower electrode is accumulated on the interlayer insulating film 7 that includes the inside of the capacitor opening portion.

Next, referring to FIG. 12B, a photo resist 24 is buried in the capacitor opening portion, and the first conductive film 8 on the interlayer insulating film 7 is removed by dry etching, thus forming the lower electrode 8.

Next, referring to FIG. 13A, a capacitance insulating film 9 and an upper electrode material 10 are accumulated, followed by removal of the capacitance insulating film 9 and the upper electrode material 10 over the interlayer insulating film 7 by, for example, CMP, thus forming inside the capacitor opening portion the capacitance insulating film 9 serving as a capacitor and an upper electrode 10.

Finally, referring to FIG. 13B, a bit-line contact plug 13 is formed through the interlayer insulating film 7 and the silicon nitride film 6 to be connected to the contact plug 5. Then, an interlayer insulating film 12 is accumulated, and a bit-line pad 18 and an upper electrode wiring 19 are formed by, for example, a Cu damascene process. In this case, the bit line is formed as an upper layer relative to the interlayer insulating film 12. Then, an upper layer wiring is formed by a method known in the art. Thus, a semiconductor memory device of the CUB structure is complete.

Similarly to the first embodiment, the CUB structure in this embodiment is as shown in FIG. 10A, where the capacitor opening portion 16 and the bit-line contact plug 13 are formed with a predetermined margin "a" secured in between. This makes the predetermined margin smaller than the conventional margin a1+a2. Thus, the capacitor opening portion 16 can be made larger than conventional ones by the length a provided that the memory cell size is constant. This results in an increased volume for the capacitor opening portion 16, thereby preventing mal-operation of DRAM that is otherwise caused by a shortage of stored charge.

Third Embodiment

FIGS. 14A and 14B are cross sectional views of a semiconductor memory device according to a third embodiment of the present invention, showing the process of fabricating the semiconductor memory device. The layout of the memory cells of this embodiment is the same as the layout shown in FIG. 1. In the figures, the region A denotes a cross section of the device taken along the line IIa-IIa in FIG. 1, and the region B denotes a cross section of the device taken along the line IIb-IIb in FIG. 1.

First, the upper electrode 8 is formed in the capacitor opening portion 16 through similar steps to those in the first embodiment as shown in FIG. 4A through 5B.

Next, referring to FIG. 14A, over the first interlayer insulating film 7 including the inside of the capacitor opening portion 16, an insulating film 9 for use in forming a capacitance insulating film and a conductive film 10 for use in forming an upper electrode are accumulated, followed by formation of a line-form resist pattern 25 over the interlayer insulating film 7 located between adjacent capacitor opening portions 16. Here the resist is allowed to remain in the capacitor opening portion 16 to protect the upper electrode 10. This is carried out by controlling the exposure energy during the resist exposure.

Figure 16:
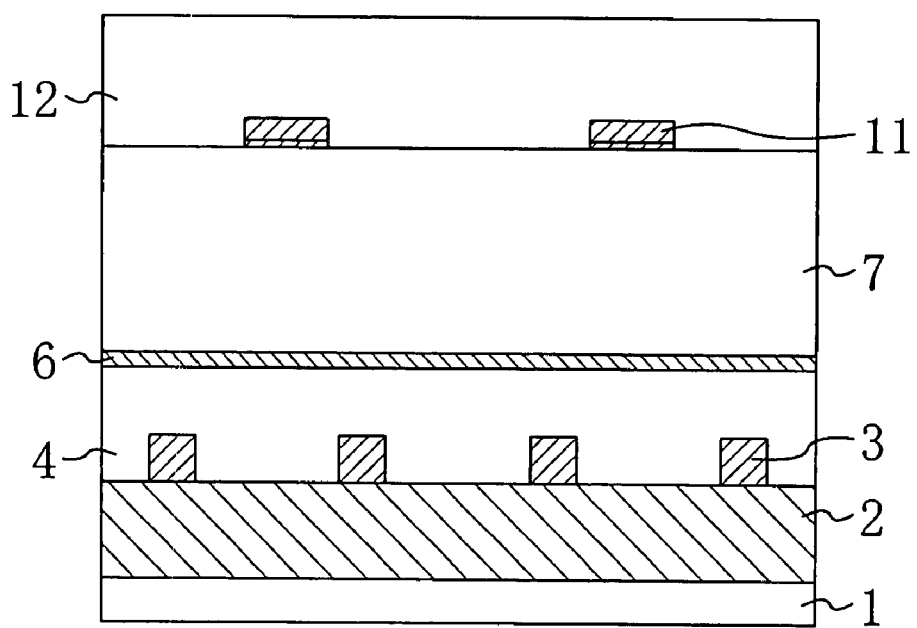
FIG. 16 is a cross sectional view of the upper electrode wiring of the third embodiment of the present invention, showing the structure of the upper electrode wiring.

Subsequently, the insulating film 9 and the conductive 10 are etched using the photo resist 25 as a mask, thus forming the capacitance insulating film 9 and the upper electrode 10 in the capacitor opening portion 16. In the region B, upper electrodes 10 formed over the sides of adjacent capacitor opening portions 16 are electrically connected to each other by the upper electrode wiring 11 formed on the first interlayer insulating film 7, as shown in FIG. 16.

Next, referring to FIG. 14B, over the first interlayer insulating film 7, a second interlayer insulating film 12 is accumulated as if to cover the capacitor opening portion 16. Then, a bit-line contact plug 13 is formed through the first and second interlayer insulating films 7 and 12 and a silicon nitride film 6 to be connected to the contact plug 5. Then, a metal wiring 114 serving as a bit line is formed on the second interlayer insulating film 12, followed by formation of an upper layer wiring by a method known in the art. Thus, a semiconductor memory device of the CUB structure is complete.

The CUB structure in this embodiment is similar to the first embodiment in that the capacitor opening portion 16 and the bit-line contact plug 13 are formed with a predetermined margin "a" secured in between. This makes the predetermined margin smaller than the conventional margin a1+a2. Thus, the capacitor opening portion 16 can be made larger than conventional ones by the length a provided that the memory cell size is constant. This results in an increased volume for the capacitor opening portion 16, thereby preventing mal-operation of DRAM that is otherwise caused by a shortage of stored charge.

Even though preferred embodiments of the invention have been illustrated and described herein, they are not intended to limit the invention and changes and modifications may be made. For example, while in the above embodiments the upper edge of the upper electrode 8, which is formed inside the capacitor opening portion 16, is recessed relative to the surface of the interlayer insulating film 7, the upper edge can be etched to be on the same plane as the upper surface of the interlayer insulating film 7. Although this disables the lower electrode 8 to function as a capacitance, when the area of the upper edge of the lower electrode 8 is smaller than the amount of recession of the lower electrode 8 relative to the surface of the interlayer insulating film 7, the surface area of the capacitance element becomes larger, thereby increasing the capacitance.

What is claimed is:

1. A semiconductor memory device comprising:
   a first interlayer insulating film formed on a semiconductor substrate;
   a capacitor opening portion provided through the first interlayer insulating film;
   a lower electrode formed only in an inside of the capacitor opening portion;
   a capacitance insulating film formed on the lower electrode;
   an upper electrode formed on the capacitance insulating film;
   a second interlayer insulating film formed on the upper electrode and the first interlayer insulating film; and
   a first contact plug provided through the first interlayer insulating film and the second interlayer insulating film,
   wherein the first contact plug is provided on one side of the capacitor opening portion so as to be separated from a first side surface of the first interlayer insulating film in the capacitor opening portion,
   the lower electrode is located so that all side surfaces of the lower electrode are surrounded by the first interlayer insulating film, and all upper edges of the lower electrode are located lower than an upper surface of the first interlayer insulating film adjacent to the lower electrode, and
   a distance from the upper edge of the lower electrode formed on the first side surface of the first interlayer insulating film to an upper surface of the first interlayer insulating film adjacent to the lower electrode is larger than a distance from the upper edge of the lower electrode formed on a second side surface of the first interlayer insulating film in the capacitor opening portion located vertically to the first side surface of the first interlayer insulating film to an upper surface of the first interlayer insulating film adjacent to the lower electrode.

2. The semiconductor memory device according to claim 1, wherein the upper edge of the lower electrode formed on the first side surface of the first interlayer insulating film in the capacitor opening portion is located below the upper surface of the first interlayer insulating film by a depth greater than a thickness of the capacitance insulating film.

3. The semiconductor memory device according to claim 2, wherein the upper edge of the lower electrode formed on the first side surface of the first interlayer insulating film in the capacitor opening portion is covered with the capacitance insulating film and the upper electrode.

4. The semiconductor memory device according to claim 1, wherein parts of the upper electrode formed over the second side surface of the first interlayer insulating film in the capacitor opening portion are extended over the first interlayer insulating film, so that the upper electrode is electrically connected to another adjacent upper electrode by extended portions of the upper electrode.

5. The semiconductor memory device according to claim 4, wherein the extended portions of the upper electrodes over the first interlayer insulating film are formed in an inside of a ditch portion formed on the upper surface of the first interlayer insulating film.

6. The semiconductor memory device according to claim 4, wherein the extended portions of the upper electrodes over the first interlayer insulating film are each composed of a wiring layer made of a material different from a material of the upper electrodes.

7. The semiconductor memory device according to claim 1, wherein:
   a bit line is formed on the second interlayer insulating film, the bit line being connected to the first contact plug.

8. The semiconductor memory device according to claim 1, further comprising:
   an MIS transistor having a gate electrode formed on the semiconductor substrate and source/drain regions on both sides of the gate electrode on the semiconductor substrate; and
   a third interlayer insulating film formed over the semiconductor substrate, the third interlayer insulating film covering the MIS transistor, wherein:
   the lower electrode is connected to one of a source region and a drain region of the MIS transistor via a second contact plug formed through the third interlayer insulating film; and
   the first contact plug is connected to the other one of the source region and the drain region of the MIS transistor via a third contact plug formed through the third interlayer insulating film.

9. The semiconductor memory device according to claim 1, wherein the capacitance insulating film is not formed on the upper surface of the first interlayer insulating film located between the capacitor opening portion and the first contact plug.

10. The semiconductor memory device according to claim 1, wherein
    a height of an upper edge of the upper electrode formed on the first side surface of the first interlayer insulating film in the capacitor opening portion is the same as a height of the upper surface of the first interlayer insulating film.

11. The semiconductor memory device according to claim 1, wherein
    a height of an upper edge of the capacitance insulating film formed on the first side surface of the first interlayer insulating film in the capacitor opening portion is the same as a height of the upper surface of the first interlayer insulating film.

12. The semiconductor memory device according to claim 1, wherein the second interlayer insulating film is formed so as to be in contact with the upper surface of the first interlayer insulating film located between the capacitor opening portion and the first contact plug.

13. The semiconductor memory device according to claim 1, wherein the capacitance insulating film is formed so as to be in contact with the first side surface of the first interlayer insulating film located over the upper edge of the lower electrode in the capacitor opening portion.

14. The semiconductor memory device according to claim 1, wherein the upper electrode is not formed on the upper surface of the first interlayer insulating film located between the capacitor opening portion and the first contact plug.

15. The semiconductor memory device according to claim 1, wherein
    the first side surface of the first interlayer insulating film in the capacitor opening portion has a tapered shape.

16. The semiconductor memory device according to claim 1, wherein the second interlayer insulating film is buried in the capacitor opening portion through the upper electrode.

* * * * *